(12) United States Patent
Tokubo

(10) Patent No.: US 11,462,504 B2
(45) Date of Patent: Oct. 4, 2022

(54) SEMICONDUCTOR APPARATUS

(71) Applicant: Mitsubishi Electric Corporation, Tokyo (JP)

(72) Inventor: Koichi Tokubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 13 days.

(21) Appl. No.: 17/064,731

(22) Filed: Oct. 7, 2020

(65) Prior Publication Data

US 2021/0280554 A1 Sep. 9, 2021

(30) Foreign Application Priority Data

Mar. 6, 2020 (JP) .............................. JP2020-038809

(51) Int. Cl.
*H01L 23/00* (2006.01)
*H01L 23/495* (2006.01)
*H01L 23/31* (2006.01)

(52) U.S. Cl.
CPC .......... *H01L 24/48* (2013.01); *H01L 23/3107* (2013.01); *H01L 23/49586* (2013.01); *H01L 24/32* (2013.01); *H01L 2224/32225* (2013.01); *H01L 2224/40091* (2013.01); *H01L 2224/4807* (2013.01); *H01L 2224/48505* (2013.01); *H01L 2224/73265* (2013.01)

(58) Field of Classification Search
CPC .............. H01L 24/48; H01L 23/3107; H01L 23/49586; H01L 24/32; H01L 2224/32225; H01L 2224/40091; H01L 2224/4807; H01L 2224/48505; H01L 2224/73265; H01L 23/49513; H01L 23/3737; H01L 23/4334; H01L 23/4952; H01L 23/49562; H01L 23/49575
See application file for complete search history.

(56) References Cited

U.S. PATENT DOCUMENTS

| | | | | |
|---|---|---|---|---|
| 2008/0265386 A1* | 10/2008 | Muto | ..................... | H01L 24/05 |
| | | | | 257/676 |
| 2012/0319259 A1* | 12/2012 | Kim | .................. | H01L 23/49575 |
| | | | | 257/676 |
| 2013/0011970 A1* | 1/2013 | Honda | .................. | G01L 19/148 |
| | | | | 438/118 |

(Continued)

FOREIGN PATENT DOCUMENTS

| | | | |
|---|---|---|---|
| JP | H10-32218 A | 2/1998 | |
| WO | WO-2018194090 A1 * | 10/2018 | ............. H01L 25/07 |

*Primary Examiner* — Douglas W Owens
(74) *Attorney, Agent, or Firm* — Studebaker & Brackett PC

(57) ABSTRACT

A semiconductor apparatus includes: a metal plate; a semiconductor device mounted on the metal plate; an external terminal electrically connected to the semiconductor device or the metal plate; a metal wire wire-bonded to the semiconductor device, the metal plate or the external terminal; and a package covering and resin-sealing the semiconductor device, the metal plate and the metal wire, wherein the metal wire is bonded to a top-layer electrode of the semiconductor device at a first bond and a second bond, and the metal wire includes a low loop that is positioned between the first bond and the second bond, is adjacent to at least one of the first bond and the second bond and is not in contact with the top-layer electrode.

22 Claims, 2 Drawing Sheets

(56) References Cited

U.S. PATENT DOCUMENTS

| 2013/0020687 A1* | 1/2013 | Kim | H01L 23/4334 257/676 |
| 2020/0266129 A1* | 8/2020 | Higashi | H01L 21/4889 |
| 2021/0125904 A1* | 4/2021 | Sugimachi | H01L 23/49555 |

* cited by examiner

SEMICONDUCTOR APPARATUS

BACKGROUND OF THE INVENTION

Field

The present disclosure relates to a semiconductor apparatus, and in particular to a semiconductor apparatus including a metal wire.

Background

In a hitherto-used semiconductor apparatus, in order to reduce the tensile stress due to thermal expansion and contraction that occurs at the usage environment temperature, a wire interconnection loop having a sufficient height is formed by ultrasonic bonding onto semiconductor devices to provide electrical internal connection (see JP H10-32218 A (paragraph 0013 and FIG. 1), for example).

SUMMARY

However, in the case where the semiconductor devices mounted in such semiconductor apparatus are so-called power semiconductor devices in which high current is used and power is controlled, since the semiconductor device manufacturing process has recently been stabilized and the semiconductor device cost has been reduced so that progress has been made in shrinking semiconductor devices and the size of the semiconductor device has been reduced, the wire bonds need to be separated, which precludes formation of a wire interconnection loop having a sufficient height.

An object of the present disclosure, which has been made to solve the aforementioned problem, is to deal with semiconductor device shrinking, obtain highly reliable wire interconnections through metal wires, and provide a semiconductor apparatus that can have high current capacity and can be made small in size.

A semiconductor apparatus according to the present disclosure includes: a metal plate; a semiconductor device mounted on the metal plate; an external terminal electrically connected to the semiconductor device or the metal plate; a metal wire wire-bonded to the semiconductor device, the metal plate or the external terminal; and a package covering and resin-sealing the semiconductor device, the metal plate and the metal wire, wherein the metal wire is bonded to a top-layer electrode of the semiconductor device at a first bond and a second bond, and the metal wire includes a low loop that is positioned between the first bond and the second bond, is adjacent to at least one of the first bond and the second bond and is not in contact with the top-layer electrode.

In the present disclosure, even if the semiconductor device is shrunk and the size of the semiconductor device is reduced, wire interconnections through the metal wire can be achieved. Furthermore, it is possible to obtain highly reliable wire interconnections and to provide a semiconductor apparatus that can have high current capacity and can be made small in size.

Other and further objects, features and advantages of the invention will appear more fully from the following description.

DESCRIPTION OF EMBODIMENTS

First Embodiment

Figure 1:
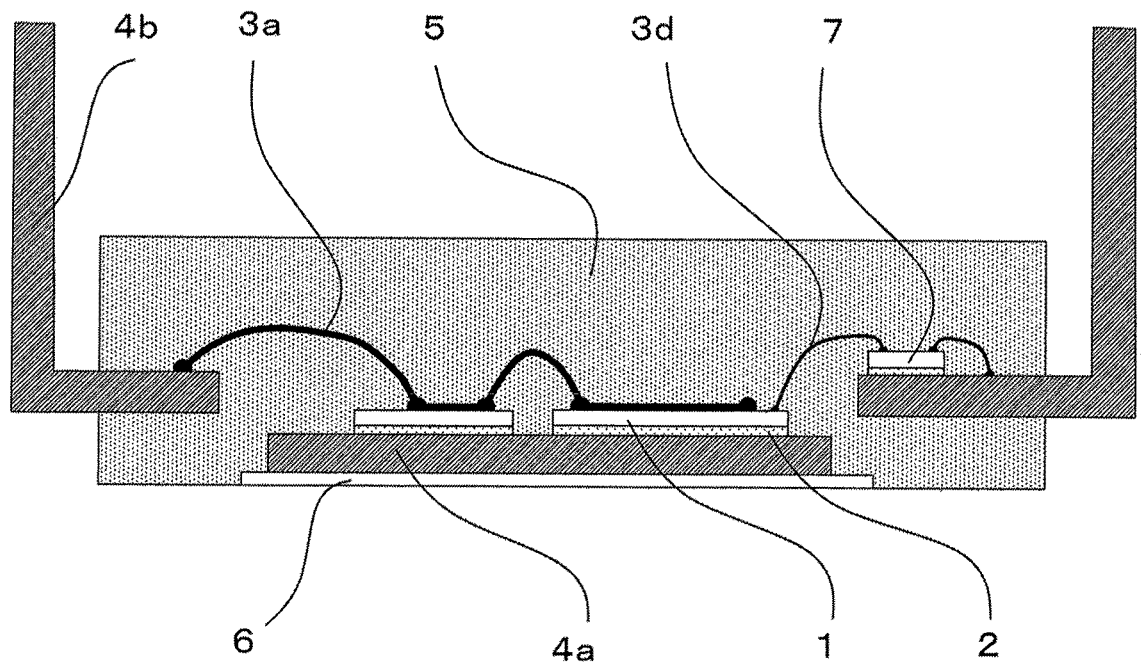
FIG. 1 is a cross-sectional view showing a semiconductor apparatus according to the first embodiment.

The configuration of the semiconductor apparatus according to the first embodiment will now be described. FIG. 1 is a cross-sectional view showing the configuration of the semiconductor apparatus according to the first embodiment.

As shown in FIG. 1, multiple external terminals 4b are exposed on the opposite side surfaces of the package 5 including the semiconductor device 1, and extend being bent at the generally right angle. The external terminals 4b are mounted on a control board having a control circuit (not shown in the drawing) and electrically connected to a device outside of the semiconductor apparatus.

Inside the package 5, the semiconductor device 1 is mounted on the lead frame 4a, wire-bonded using the metal wire 3a and connected to the external terminal 4b. Note that the required number of semiconductor devices 1 having the required ratings can be mounted according to the specifications of the semiconductor apparatus. Although the metal wire 3a is wire-bonded to the semiconductor device 1 and the external terminals 4b in FIG. 1, this is not necessarily the case and the metal wire 3a is connected to the lead frame 4a as necessary according to the circuit configuration with the lead frame 4a.

The package 5 is encapsulated and packaged by transfer molding in which resin is injected into a mold. The resin encapsulating the package 5 is mainly composed of an epoxy resin but is not limited to this, and may be any thermosetting resin having a desired elastic modulus and adhesiveness.

The semiconductor device 1, which is a so-called power semiconductor device controlling power and composed of Si, is, for example, an insulated gate bipolar transistor (IGBT), a metal-oxide-semiconductor field-effect transistor (MOSFET), or a freewheeling diode (FWD). The length of one side of the semiconductor device 1 is about 3 mm to 13 mm. The device is not necessarily composed of Si, but may be composed of a wide bandgap semiconductor such as SiC or GaN.

The semiconductor device 1 is mounted on the lead frame 4a by bonding with the bonding material 2. The material for the bonding material 2 is a solder material containing Sn as a main component. Note that the bonding material 2 should be a material having heat dissipation characteristics for dissipating heat generated by the semiconductor device 1, such as a sintered material or an adhesive material containing Ag as a main component.

The semiconductor device 1 is mounted on the lead frame 4a, wire-bonded using the metal wire 3a and constitutes a circuit within the semiconductor apparatus. The thickness of the lead frame 4a ranges from about 0.3 to 1.0 mm. The lead frame 4a and the external terminals 4b are obtained by dividing a single metal plate. Accordingly, the lead frame 4a and the external terminals 4b are made of the same material and have the same thickness. The structure of the lead frame 4a having a step structure and the structure of the external terminals 4b bent at the generally right angle as shown in FIG. 1 can be obtained by cutting and forming a single metal plate with a mold. The lead frame 4a and the external terminals 4b are composed of a conductive metal material containing Cu as a main component. This material, which may be any conductive material having heat dissipation characteristics, may be, for example, a composite material, such as Al or Cu/Invar/Cu, or an alloy, such as CuMo.

As shown in FIG. 1, an integrated circuit (IC) 7 for controlling the semiconductor device 1 is mounted on a part of the external terminals 4b through an adhesive material or bonding material 2, and is wire-bonded through a thin metal wire 3d. The IC 7 is smaller in size than, for example, an IGBT or MOSFET and has a small current value for control, and is therefore wire-bonded by ball bonding using the thin metal wire 3d. The thin metal wire 3d has a diameter of about several tens of microns and is made of a conductive metal containing any of Au, Cu, and Ag.

A dissipation insulating sheet 6 having heat dissipation characteristics and insulating characteristics is in close contact with the surface of the lead frame 4a opposite from the bonding material 2, and dissipates heat generated from the semiconductor device 1 via the lead frame 4a. The dissipation insulating sheet 6 has a two-layer structure of an insulating layer and a metal layer, and the metal layer of the dissipation insulating sheet 6 is exposed on the package 5. The dissipation insulating sheet 6 has a thermal conductivity of about 2 to 18 W/(m·K) and a thickness of about 0.1 to 0.2 mm. The insulating layer is mainly composed of a filler-containing epoxy resin. The metal layer is composed of Cu, Al, or the like having heat dissipation characteristics.

The metal wire 3a is pure Al or a conductive metal mainly composed of Al. The inside of the package 5 is wire-bonded by wire bonding in which bonding is made by ultrasonic waves continuously without cutting. The diameter of the metal wire 3a ranges from 0.1 to 0.5 mm and depends on the capacity of current flowing through the metal wire 3a. Therefore, a Cu wire mainly composed of Cu with a low electric resistance, or an Ag wire mainly composed of Ag with a still lower electric resistance may be used.

The wire interconnections through the metal wire 3a between each external terminal 4b and the semiconductor device 1 and between the semiconductor devices 1 form a loop having a height of at least 2 to 3 times the diameter of the metal wire 3a. Note that the metal wire 3a is not exposed on the package 5.

Figure 2:
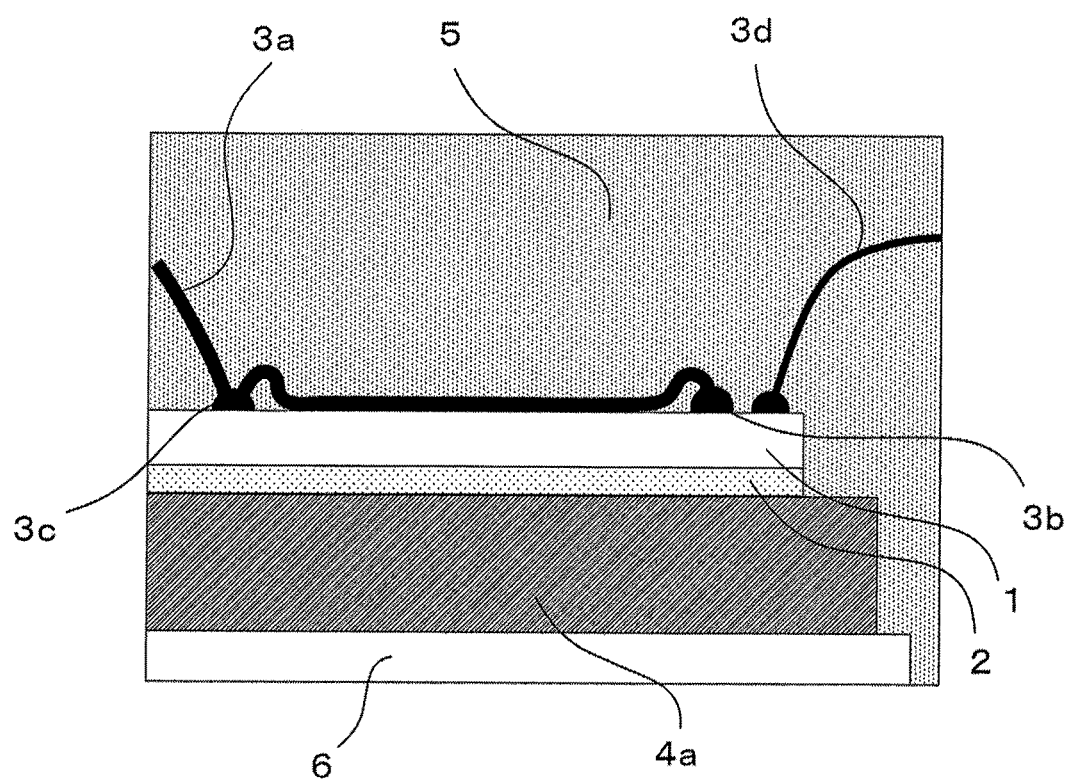
FIG. 2 is an enlarged cross-sectional view showing the semiconductor apparatus according to the first embodiment.

Meanwhile, FIG. 2 is an enlarged cross-sectional view of the metal wire 3a on the top-layer electrode of the semiconductor device 1. At a first bond 3b which is the first wire bonding point, an ultrasonically vibrating tool attached to the wire head in the wire bonding device (not shown in the drawing) comes in contact with the metal wire 3a and supplies ultrasound for bonding to the top-layer electrode of the semiconductor device 1. After bonding, the wire head in the wire bonding device (not shown in the drawing) moves toward a second bond 3c, which is the next bond, and thus rises together with the attached tool from the first bond 3b of the top-layer electrode of the semiconductor device 1 to such an extent that damage and scratches to the semiconductor device 1 are suppressed (upward to the viewer in FIG. 2). Subsequently, it moves above and in parallel with the top-layer electrode of the semiconductor device 1 toward the second bond 3c on the top-layer electrode of the semiconductor device 1. Since the distance of the rise of the wire head is such that damage and scratches to the semiconductor device 1 are suppressed, it is possible to suppress the influence on the tact time of interconnection through the metal wire 3a.

Consequently, immediately after bonding to the first bond 3b, the metal wire 3a forms a low loop that is not in contact with the top-layer electrode of the semiconductor device 1. Afterwards, the metal wire 3a is not cut, and the wire head moves above and in parallel with the top-layer electrode of the semiconductor device 1, whereby the metal wire 3a is linearly positioned so as to come in contact with the top-layer electrode of the semiconductor device 1. At the second bond 3c, which is the next wire bonding point, the metal wire 3a is bonded by applying ultrasonic vibration, so that the wire head of the wire bonding device (not shown in the drawing) descends (downward to the viewer in FIG. 2) and the metal wire 3a is pulled back, thereby forming a low loop that is not in contact with the top-layer electrode of the semiconductor device 1.

The metal wire 3a is then bonded to the top-layer electrode of the semiconductor device 1 at the second bond 3c. Subsequently, as necessary, the wire head of the wire bonding device (not shown in the drawing) moves toward another semiconductor device 1 or the external terminal 4b, which is the next wire bonding point, to form a wiring shape. Finally, the metal wire 3a is cut by the cutter attached to the wire head. The height of the low loop of the metal wire 3a with respect to the top-layer electrode of the semiconductor device 1 is less than twice the diameter of the metal wire 3a, and the metal wire 3a is not in contact with the top-layer electrode of the semiconductor device 1.

The top-layer electrode of the semiconductor device 1 to which the metal wire 3a is bonded is composed of Al or Al—Si and has a thickness of about 0.003 to 0.005 mm. The electrodes bonded to or being contact with the metal wire 3a have the same electric potential as the top-layer electrode of the semiconductor device 1.

As shown in FIG. 1 and FIG. 2, such a wire interconnection shape of the metal wire 3a with respect to the top-layer electrode of the semiconductor device 1 eliminates the need for a large loop between the external terminal 4b and the semiconductor device 1 and between the semiconductor devices 1. As such, even if the semiconductor device 1 is shrunk and the size of the semiconductor device 1 is reduced, wire interconnections through the metal wire 3a can be achieved. Moreover, the mounting area required for the semiconductor device 1 is reduced, so that the semiconductor apparatus can be downsized.

Besides, as shown in FIG. 2, in addition to the first bond 3b and the second bond 3c on the top-layer electrode of the semiconductor device 1, the metal wire 3a is linearly in contact with the top-layer electrode of the semiconductor device 1, ensuring a large contact area and a sufficient current-carrying area. It is therefore possible to deal with the large current capacity of the semiconductor apparatus without increasing the package size of the semiconductor apparatus.

The semiconductor apparatus has a rated voltage of 600 V or 1200 V and a rated current of about 5 A to 150 A. In order to control the semiconductor device 1, the IC 7 is mounted on the external terminal 4b. Further, for the converter and the brake function are provided, a diode for the converter and an IGBT for the brake can be mounted on the lead frame 4a and can be built in the same semiconductor apparatus. Similarly, the metal wire 3a can form wire interconnections in the diode for the converter and the IGBT for the brake.

The semiconductor apparatus according to the first embodiment consists of the semiconductor device 1, the lead frame 4a mounted with the semiconductor device 1, the metal wire 3a establishing a wire interconnection between the semiconductor device 1 and the external terminal 4b, and the package 5 resin-encapsulated covering the semiconductor device 1, the lead frame 4a, and the metal wire 3a. The metal wire 3a is bonded to the top-layer electrode of the semiconductor device 1 at the first bond 3b and the second bond 3c. Between the first bond 3b and the second bond 3c, the metal wire 3a forms a low loop that is adjacent to at least one of the first bond 3b and the second bond 3c and is not in contact with the top-layer electrode. With the aforementioned configuration, the metal wire 3a does not need to form a large loop, so that wire interconnections using the metal wire 3a can be achieved even if the semiconductor device size is reduced by shrinking the semiconductor device 1. Additionally, the wire interconnections through the metal wire 3a described above can reduce the size of the semiconductor apparatus.

Further, in addition to the first bond 3b and the second bond 3c on the top-layer electrode of the semiconductor device 1, the metal wire 3a is linearly in contact with the top-layer electrode of the semiconductor device 1, ensuring a large contact area and thus a sufficient current-carrying area. It is therefore possible to deal with the large current capacity of the semiconductor apparatus without increasing the package size of the semiconductor apparatus.

Since the metal wire 3a is not exposed on the package 5, transfer molding encapsulation of the metal wire 3a using a resin allows the metal wire 3a and the semiconductor device 1 to be closely fixed through the encapsulation resin. This suppresses cracks and cuts in the metal wire 3a and enhances the reliability of a bond of the metal wire 3a to the top-layer electrode of the semiconductor device 1.

Note that the shrink of the semiconductor device 1 is not necessarily the case, and wire interconnections through the metal wire 3a can be made for small-size semiconductor devices 1. Naturally, the size of the semiconductor apparatus can be reduced.

The lead frame 4a, which is used as an example in the aforementioned embodiment, may be any frame that exerts the function of its component, the metal plate. Other insulating substrates can be adopted similarly and provide the same effects. To be specific, an insulating substrate may be used instead of the lead frame 4a and the dissipation insulating sheet 6. The insulating substrate consists of a conductive metal layer and an insulating layer of a ceramic that is $Al_2O_3$, AN, $Si_3N_4$, or the like. As such, the use of the insulating substrate greatly enhances the heat dissipation characteristics to as high as several tens of watts per meter-kelvin or more, thereby ensuring sufficient heat dissipation characteristics against the heat generated by the semiconductor device 1 and reducing the size of the semiconductor apparatus, and at the same time, allowing the characteristics of the semiconductor device 1 to be sufficiently exhibited and functioned without deteriorating the characteristics of the semiconductor device 1.

In the case of the insulating substrate described above, the needed heat dissipation characteristics for the semiconductor device 1 can be sufficiently ensured; thus, when a device of a wide bandgap semiconductor, such as SiC or GaN, is mounted as the semiconductor device 1, the effects become remarkable.

The semiconductor device 1 on the insulating substrate may be surrounded by a resin-molded case which is filled and encapsulated with a gel material mainly composed of silicone resin or an epoxy resin, in which case the semiconductor apparatus can be made small in size and have a high current capacity through the aforementioned wire interconnections using the metal wire 3a.

A cooler having fins can optionally be attached, through heat dissipation grease, to the dissipation insulating sheet 6 exposed on the package 5, the insulating substrate, or the heat dissipation plate attached to the insulating substrate for further improving the heat dissipation characteristics. For instance, it is used as a power conversion system such as an inverter, in which case a reduction in the semiconductor apparatus size results in significant contribution to a reduction in the size of this inverter or other power semiconductor apparatus systems.

Second Embodiment

Figure 3:
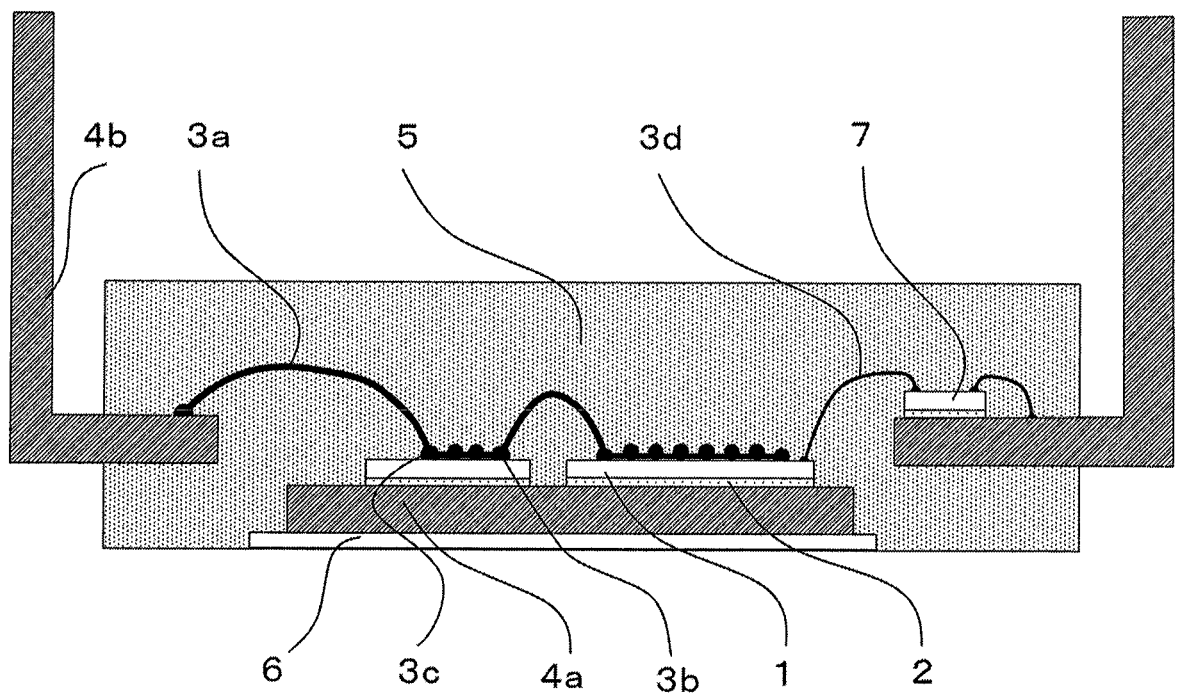
FIG. 3 is a cross-sectional view showing a semiconductor apparatus according to the second embodiment.

FIG. 3 is a cross-sectional view showing the semiconductor apparatus according to the second embodiment. The semiconductor apparatus according to this embodiment has many configurations in common with the first embodiment. Hence, things different from those in the semiconductor apparatus according to the first embodiment will be described, and the same or corresponding configurations will be denoted by the same reference numerals and the description thereof will be omitted. As shown in FIG. 3, this embodiment is different from the first embodiment in that the linear metal wire 3a is continuously bonded to multiple points of the top-layer electrode of the semiconductor device 1 without being cut.

The metal wire 3a is bonded to at least three sites of the top-layer electrode of the semiconductor device 1 and is linearly positioned. The portion other than the bonds to the metal wire 3a located on the top-layer electrode of the semiconductor device 1 are desirably, but not necessarily, in contact with the top-layer electrode of the semiconductor device 1.

The bonding strength of each bond is enough to, for example, prevent separation at the bonding interface between the top-layer electrode of the semiconductor device 1 and the metal wire 3a in a peeling test. Further, an adequate bonding life can be satisfied under the usage environment temperature of the semiconductor apparatus.

Note that the metal wire 3a on the top-layer electrode of the semiconductor device 1 located on the left to the viewer in FIG. 3 forms a low loop between a second bond 3c that is wire-bonded to the external terminal 4b and a first bond 3b that is connected to another semiconductor device 1, and the loop is adjacent to each bond and not in contact with the top-layer electrode of the semiconductor device 1.

The metal wire 3a on the top-layer electrode of the semiconductor device 1 located on the right to the viewer in FIG. 3 is wire-bonded to the other semiconductor device 1, and forms, at the bond on the top-layer electrode of the semiconductor device 1, a low loop adjacent to each bond and not in contact with the top-layer electrode of the semiconductor device 1.

Also in the second embodiment, a semiconductor device 1 is mounted on a lead frame 4a, the semiconductor device 1 and external terminals 4b are wire-bonded through the metal wire 3a, and in a resin-encapsulated package 5 covering the semiconductor device 1, the lead frame 4a, and the metal wire 3a, the metal wire 3a is linearly bonded to at least three sites of the top-layer electrode of the semiconductor device 1. With the aforementioned configuration, the metal wire 3a does not need to form a large loop, so that wire interconnections using the metal wire 3a can be achieved even if the semiconductor device size is reduced by shrinking the semiconductor device 1. In addition, the wire interconnections through the metal wire 3a can reduce the size of the semiconductor apparatus.

With at least three bonds where the metal wire 3a has adequate bonding strength to the top-layer electrode of the semiconductor device 1, reliable wire interconnections through the metal wire 3a can be obtained even if the metal wire 3a forms a low loop.

Since the metal wire 3a has three or more bonds on the top-layer electrode of the semiconductor device 1, even if more than expected thermal stress is applied to the bonds due to heat generation by the semiconductor device 1 or the usage environment temperature of the semiconductor apparatus and partial cracking or separation occurs, the semiconductor apparatus can be operated as a semiconductor apparatus.

With at least three bonds with adequate bonding strength between the metal wire 3a and the top-layer electrode of the semiconductor device 1, an adequate current-carrying area can be ensured, allowing the semiconductor apparatus to have a large current capacity without increasing the package size.

Third Embodiment

Figure 4:
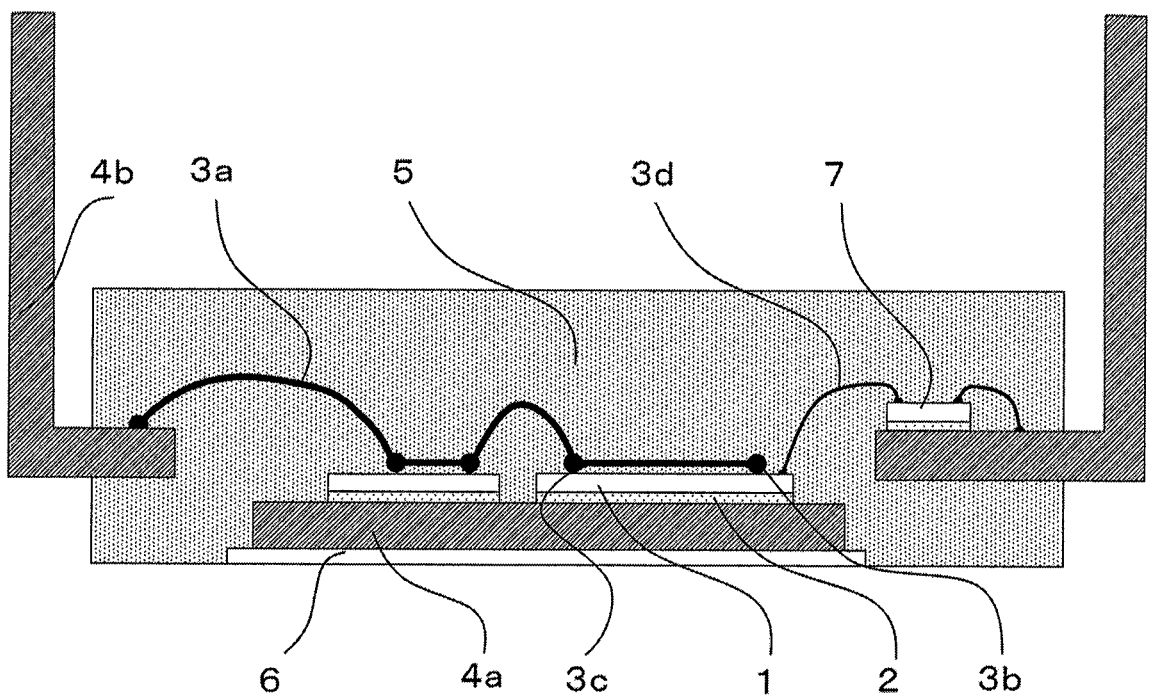
FIG. 4 is a cross-sectional view showing a semiconductor apparatus according to the third embodiment.

FIG. 4 is a cross-sectional view showing the semiconductor apparatus according to the third embodiment. The semiconductor apparatus according to this embodiment has many configurations in common with the first embodiment. Hence, things different from those in the semiconductor apparatus according to the first embodiment will be described, and the same or corresponding configurations will be denoted by the same reference numerals and the description thereof will be omitted. As shown in FIG. 4, this embodiment differs from the first embodiment in that the portion of the metal wire 3a except the first bond 3b and the second bond 3c where the metal wire 3a is bonded to the top-layer electrode of the semiconductor device 1 is separated from the top-layer electrode of the semiconductor device 1 by a certain distance, providing linear wiring not in contact with the top-layer electrode of the semiconductor device 1.

The portion of the metal wire 3a except the first bond 3b and the second bond 3c where the metal wire 3a is bonded to the top-layer electrode of the semiconductor device 1 is separated from the top-layer electrode of the semiconductor device 1 by a certain distance, providing linear wiring not in contact with the top-layer electrode of the semiconductor device 1. As shown in FIG. 4, the metal wire 3a is located in parallel to the top-layer electrode of the semiconductor device 1. Note that between the first bond 3b and the second bond 3c, the metal wire 3a forms a low loop that is adjacent to the first bond 3b and the second bond 3c and is not in contact with the top-layer electrode of the semiconductor device 1.

Also in the third embodiment, the semiconductor device 1 is mounted on the lead frame 4a; the semiconductor device 1 and the external terminal 4b are wire-bonded through the metal wire 3a; in a resin-encapsulated package 5 covering the semiconductor device 1, the lead frame 4a, and the metal wire 3a, the metal wire 3a is bonded to the top-layer electrode of the semiconductor device 1 at the first bond 3b and second bond 3c; and between the first bond 3b and the second bond 3c, the metal wire 3a is not contact with but linearly positioned with respect to the top-layer electrode of the semiconductor device 1. With the aforementioned configuration, the metal wire 3a does not need to form a large loop, so that wire interconnections using the metal wire 3a can be achieved even if the semiconductor device size is reduced by shrinking the semiconductor device 1. In addition, the wire interconnections through the metal wire 3a can reduce the size of the semiconductor apparatus.

It is particularly effective in the case where adequate bonding strength to the semiconductor device 1 can be obtained at the first bond 3b and the second bond 3c, an adequate bonding area can be ensured, and necessary current capacity can be ensured.

Note that the embodiments can be freely combined and modified or omitted as appropriate.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-038809, filed on Mar. 6, 2020 including specification, claims, drawings and summary, on which the convention priority of the present application is based, is incorporated herein by reference in its entirety.

The invention claimed is:

1. A semiconductor apparatus comprising:
   a metal plate;
   a semiconductor device mounted on the metal plate;
   an external terminal electrically connected to the semiconductor device or the metal plate;
   a metal wire wire-bonded to the semiconductor device and connecting the semiconductor device to the external terminal; and
   a package covering and resin-sealing the semiconductor device, the metal plate and the metal wire,
   wherein the metal wire is bonded to a top-layer electrode of the semiconductor device at a first bond and a second bond, and the metal wire is directly connected from the second bond to the external terminal, and
   the metal wire includes a low loop that is positioned between the first bond and the second bond, is adjacent to at least one of the first bond and the second bond and is not in contact with the top-layer electrode.

2. The semiconductor apparatus according to claim 1, wherein the metal wire is linearly in contact with the top-layer electrode between the low loop adjacent to the first bond and the low loop adjacent to the second bond.

3. The semiconductor apparatus according to claim 1, wherein
   the metal wire includes a second low loop that is not in contact with the top-layer electrode; and
   the metal wire is bonded to multiple points of the top-layer electrode between the low loop that is adjacent to the first bond and the second low loop that is adjacent to the second bond.

4. The semiconductor apparatus according to claim 2, wherein
   the metal wire includes a second low loop that is not in contact with the top-layer electrode; and
   the metal wire is bonded to multiple points of the top-layer electrode between the low loop that is adjacent to the first bond and the second low loop that is adjacent to the second bond.

5. The semiconductor apparatus according to claim 1, wherein the metal wire is separated from the top-layer electrode by a certain distance and is not in contact with the top-layer electrode between the low loop adjacent to the first bond and the low loop adjacent to the second bond.

6. The semiconductor apparatus according to claim 1, wherein a height of the low loop of the metal wire with respect to the top-layer electrode is less than twice a diameter of the metal wire.

7. The semiconductor apparatus according to claim 2, wherein a height of the low loop of the metal wire with respect to the top-layer electrode is less than twice a diameter of the metal wire.

8. The semiconductor apparatus according to claim 3, wherein a height of the low loop of the metal wire with respect to the top-layer electrode is less than twice a diameter of the metal wire.

9. The semiconductor apparatus according to claim 4, wherein a height of the low loop of the metal wire with respect to the top-layer electrode is less than twice a diameter of the metal wire.

10. The semiconductor apparatus according to claim 5, wherein a height of the low loop of the metal wire with respect to the top-layer electrode is less than twice a diameter of the metal wire.

11. The semiconductor apparatus according to claim 1, wherein the metal wire is made of a conductive metal containing any of Al, Cu, and Ag.

12. The semiconductor apparatus according to claim 2, wherein the metal wire is made of a conductive metal containing any of Al, Cu, and Ag.

13. The semiconductor apparatus according to claim 3, wherein the metal wire is made of a conductive metal containing any of Al, Cu, and Ag.

14. The semiconductor apparatus according to claim 4, wherein the metal wire is made of a conductive metal containing any of Al, Cu, and Ag.

15. The semiconductor apparatus according to claim 5, wherein the metal wire is made of a conductive metal containing any of Al, Cu, and Ag.

16. The semiconductor apparatus according to claim 6, wherein the metal wire is made of a conductive metal containing any of Al, Cu, and Ag.

17. The semiconductor apparatus according to claim 7, wherein the metal wire is made of a conductive metal containing any of Al, Cu, and Ag.

18. The semiconductor apparatus according to claim 8, wherein the metal wire is made of a conductive metal containing any of Al, Cu, and Ag.

19. The semiconductor apparatus according to claim 9, wherein the metal wire is made of a conductive metal containing any of Al, Cu, and Ag.

20. The semiconductor apparatus according to claim 10, wherein the metal wire is made of a conductive metal containing any of Al, Cu, and Ag.

21. A semiconductor apparatus comprising:
a metal plate;
a semiconductor device mounted on the metal plate;
an external terminal electrically connected to the semiconductor device or the metal plate;
a metal wire wire-bonded to the semiconductor device, the metal plate or the external terminal; and
a package covering and resin-sealing the semiconductor device, the metal plate and the metal wire,
wherein the metal wire is bonded to a top-layer electrode of the semiconductor device at a first bond and a second bond, and
the metal wire includes a low loop and a second low loop that are positioned between the first bond and the second bond, the low loop is adjacent to the first bond and is not in contact with the top-layer electrode, and the second low loop is adjacent to the second bond and is not in contact with the top-layer electrode, and the metal wire is bonded to multiple points of the top-layer electrode between the low loop and the second low loop.

22. A semiconductor apparatus comprising:
a metal plate;
a semiconductor device mounted on the metal plate;
an external terminal electrically connected to the semiconductor device or the metal plate;
a metal wire wire-bonded to the semiconductor device, the metal plate or the external terminal; and
a package covering and resin-sealing the semiconductor device, the metal plate and the metal wire,
wherein the metal wire is bonded to a top-layer electrode of the semiconductor device at a first bond and a second bond,
the metal wire includes a low loop that is positioned between the first bond and the second bond, is adjacent to at least one of the first bond and the second bond and is not in contact with the top-layer electrode, and
a height of the low loop of the metal wire with respect to the top-layer electrode is less than twice a diameter of the metal wire.

* * * * *